United States Patent [19]
Öhlander et al.

[11] Patent Number: 6,011,811
[45] Date of Patent: *Jan. 4, 2000

[54] BURIED HETEROSTRUCTURE WITH ALUMINUM-FREE ACTIVE LAYER AND METHOD OF MAKING SAME

[75] Inventors: Ulf Öhlander, Stockholm; Michael Rask, Ekerö; Björn Stoltz, Stockholm, all of Sweden

[73] Assignee: Telefonaktiebolaget LM Ericsson, Stockholm, Sweden

[ * ] Notice: This patent issued on a continued prosecution application filed under 37 CFR 1.53(d), and is subject to the twenty year patent term provisions of 35 U.S.C. 154(a)(2).

[21] Appl. No.: 08/806,621

[22] Filed: Feb. 26, 1997

[30] Foreign Application Priority Data

Feb. 27, 1996 [SE] Sweden ................................. 9600744

[51] Int. Cl.⁷ ............................. H01S 3/19; H01L 29/06; H01L 21/20

[52] U.S. Cl. ................................ 372/46; 372/43; 372/45; 372/50; 257/12; 437/129

[58] Field of Search ............................... 372/46, 45, 129, 372/51; 438/36; 257/12, 13, 22

[56] References Cited

U.S. PATENT DOCUMENTS

| | | | |
|---|---|---|---|
| 4,955,031 | 9/1990 | Jain | 372/45 |
| 5,058,120 | 10/1991 | Nitta et al. | 372/46 |
| 5,065,402 | 11/1991 | Kawano | 372/46 |

(List continued on next page.)

FOREIGN PATENT DOCUMENTS

| | | | |
|---|---|---|---|
| 078 177 | 5/1983 | European Pat. Off. | 372/45 X |
| 202 089 | 11/1986 | European Pat. Off. | 372/45 X |
| 60-136388 | 7/1985 | Japan | 372/45 X |

OTHER PUBLICATIONS

P.A. Andrekson et al., "Effect of Thermionic Electron Emission from the Active Layer on the Internal Quantum Efficiency of InGaAsP Lasers Operating at 1.3 $\mu$m," IEEE Journal of Quantum Electronics, vol. 30, No. 2, pp. 219–221 (Feb. 1994).

H. Ishikawa et al., "Analysis of Temperature Dependent Optical Gain of Strained Quantum Well Taking Account of Carriers in the SCH Layer," IEEE Photonics Technology Letters, vol. 6, No. 3, pp. 344–347 (Mar. 1994).

H. Nobuhara et al., "1.3 $\mu$m wavelength, low–threshold strained quantum well laser on p–type substrate," Electronics Letters, vol. 30, No. 16, pp. 1292–1293 (Aug. 4, 1994).

H.P. Mayer et al., "Low cost High performance Lasers for FITL/FTTH," Proc. 21st Eur. Conf. on Opt. Comm. (ECOC'95—Brussels), pp. 528–537.

(List continued on next page.)

*Primary Examiner*—Brian Healy
*Attorney, Agent, or Firm*—Burns, Doane, Swecker & Mathis, L.L.P.

[57] ABSTRACT

An epitaxially grown semiconductor heterostructure has an inner region (5) which is substantially laterally confined by confinement regions (9) and has enhanced transverse confinement by enhanced transverse confinement layers (3, 7). The latter layers are not exposed outside the growth chamber during processing, by stopping the etching for producing the lateral confinement, above the lower enhanced transverse confinement layer (3) and growing such an upper layer (7) after making the lateral confinement regions (9). The structure is intended to be used in particular having the inner region act as an active laser region, for instance in InP-based 1.3 $\mu$m wavelength lasers. Then the simultaneous lateral confinement, enhanced transverse confinement and exposure protection enables simultaneously a low threshold current, a small temperature sensitivity and reliable, long life operation. The enhanced transverse confinement layers (3, 7) could comprise aluminium protected from oxidation during processing. Such a laser will then be protected from a declined reliability.

48 Claims, 11 Drawing Sheets

Formed top structure

U.S. PATENT DOCUMENTS

| | | | |
|---|---|---|---|
| 5,102,825 | 4/1992 | Brennan et al. | 438/36 |
| 5,212,706 | 5/1993 | Jain | 372/45 |
| 5,331,655 | 7/1994 | Harder et al. | 372/45 |
| 5,349,596 | 9/1994 | Molva et al. | 372/43 |
| 5,355,384 | 10/1994 | Inoue et al. | 372/46 |
| 5,381,434 | 1/1995 | Bhat et al. | 372/45 |
| 5,412,680 | 5/1995 | Swirhun et al. | 372/46 |
| 5,619,518 | 4/1997 | Horie et al. | 372/45 |
| 5,889,805 | 3/1999 | Botez et al. | 372/45 |

OTHER PUBLICATIONS

S. Yamashita et al., "Low–Threshold (3.2 mA per Element) 1.3 $\mu$m In GaAsP MQW Laser Array on a p–Type Substrate," IEEE Photonics Technology Letters, vol. 4, No. 9, pp. 954–957 (Sep. 1992).

C. Zah et al., "High–Performance Uncooled 1.3$\Delta$m $Al_xGa_yIn_{1-x-y}As$/InP Strained–Layer Quantum–Well Lasers for Subscriber Loop Applications," IEEE Journal of Quantum Electronics, vol. 30, No. 2, pp. 511–523 (Feb. 1994).

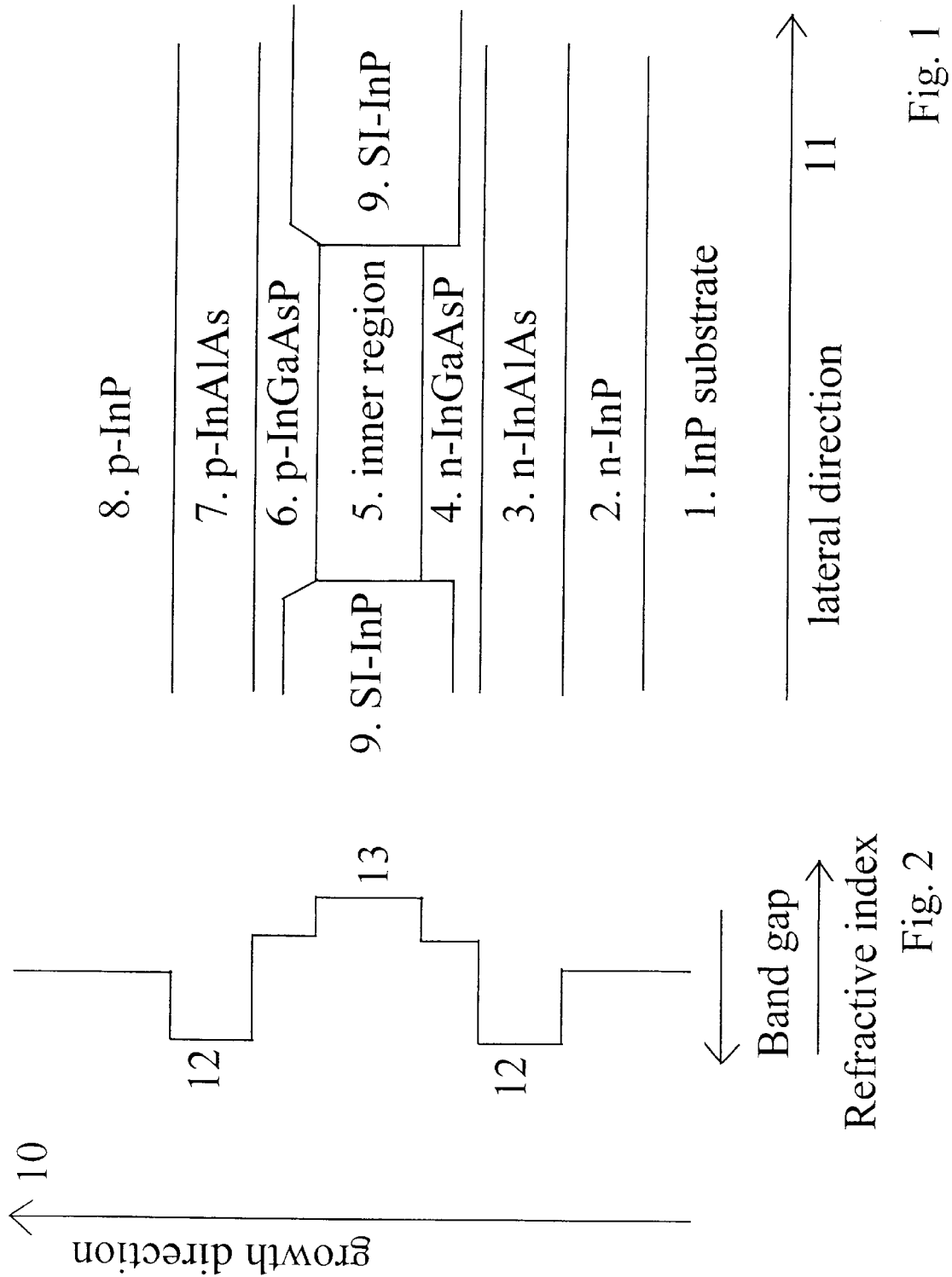

Base structure of A
grown on substrate A0

| A7. Upper separating layer(s) |
| A6. Active layer(s) |
| A5. Lower separating layer(s) |
| A4. Etch-stop layer(s) |
| A3. Lower post-buffer layer(s) |
| A2. Lower larger band-gap layer(s) |
| A1. Lower pre-buffer layer(s) |
| A0. Substrate base |

Fig. 5

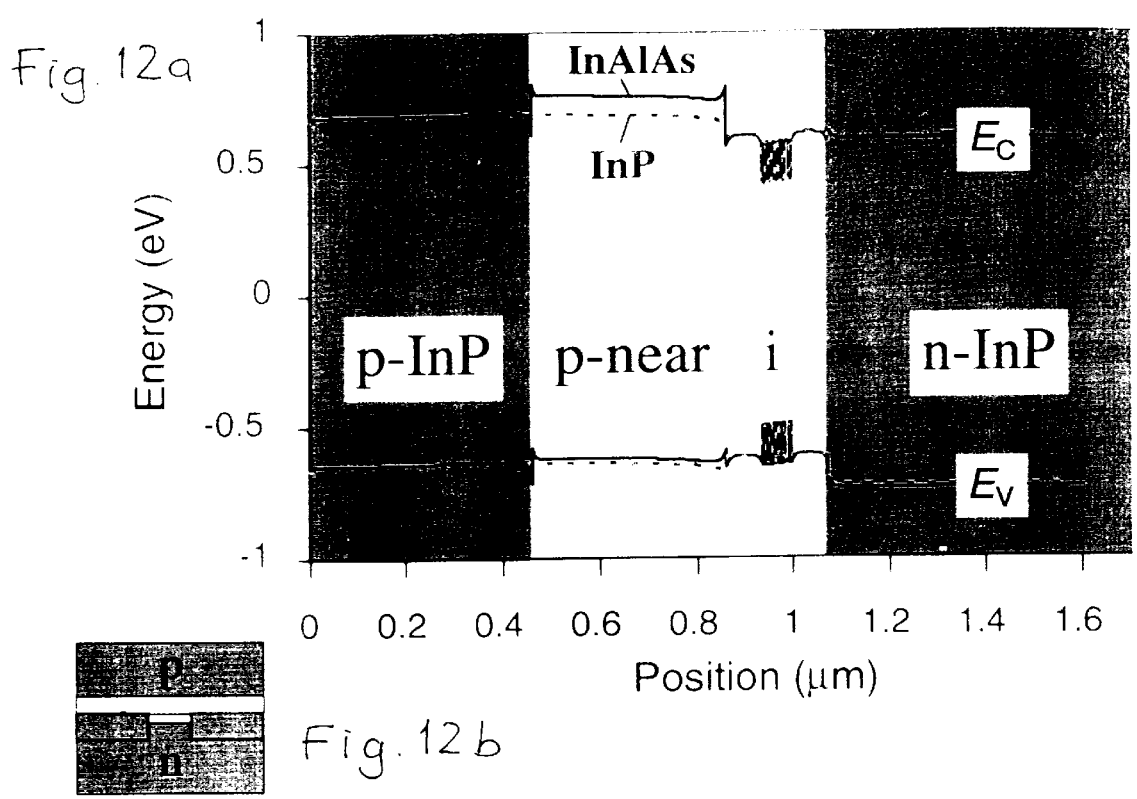

BURIED HETEROSTRUCTURE WITH ALUMINUM-FREE ACTIVE LAYER AND METHOD OF MAKING SAME

This application is a CPA of U.S. appl. Ser. No. 08/806,621, filed Feb. 26, 1997, now abandoned.

TECHNICAL FIELD

The present invention relates to a structure for carrier confinement, in particular for InP-based lasers and other optoelectronic devices.

BACKGROUND OF THE INVENTION

InP-based 1.3 μm wavelength lasers which operate at high temperatures and are intended for low threshold and/or low bias current operation are believed to play an important role as transmitters in future access networks, see S. Yamashita et al. "Low-threshold (3.2 mA per element) 1.3 μm InGaAsP MQW laser array on a p-type substrate", IEEE Photonics Technology Letters, vol. 4, No. 9, pp. 954–957, 1992 and H. Nobuhara et al. "1.3 μm wavelength, low-threshold strained quantum well laser on p-type substrate", Electronic Letters, vol. 30, No. 16, pp. 1292–1293, 1994.

Due to the expected high temperatures it is crucial to improve their poor temperature dependence, which is believed to be partly caused by poor carrier confinement or carrier leakage in the growth, transverse direction, see P. A. Andrekson et al. "Effect of thermionic electron emission from the active layer on the internal quantum efficiency of InGaAsP lasers operating at 1.3 μm", IEEE Journal of Quantum Electronics, vol. 30, No. 2, pp. 219–221, 1994 and H. Ishikawa et al. "Analysis of temperature dependent optical gain of strained quantum well taking account of carriers in the SCH layer", IEEE Photonics Technology Letters, vol. 6, No. 3, pp. 344–347, 1994.

Thus a material is desired which has a conduction band higher than InP, i.e. a barrier, which can be epitaxially grown on InP. Materials which have been proved to have this property may contain aluminium what has also has been demonstrated by the use of alloys containing aluminium (Al) as barrier materials in lasers, see C. E. Zah et. al. "High-performance uncooled 1.3 μm $Al_xGa_yIn_{1-x-y}As$/InP strained-layer quantum-well lasers for subscriber loop applications", IEEE Journal of Quantum Electronics, Vol. 30, No. 2, pp. 511–523, 1994 and U.S. Pat. No. 5,381,434, which are incorporated herein by reference.

However, the threshold currents at room temperature of lasers having layers (barriers) containing Al for confinement of charge carriers and photons are not as low as the lowest ones reported for lasers not containing Al. The resulting operating currents at higher temperatures show no improvement compared to the best reported Al free lasers: between 30 and 45 mA for 6 mW output power @ 85° C. for facet-coated Fabry-Perot lasers, see e.g. Table 1 in H. P. Mayer et al.: "Low cost high performance lasers for FITL/FTTH", The 21st European Conference on Optical Communications, ECOC '95, Brussels, September 1995, Proceedings Volume 2, Regular Papers & Invited Papers, pp. 529–536, 1995. The reliability or life time of lasers containing Al compared to lasers not containing Al is a critical issue, since alloys containing Al may react, in the manufacture of such lasers, by oxidation when exposed outside the chamber for epitaxial growth during etching and regrowth processing.

The experimental results obtained by C. E. Zah et al.: "High-performance uncooled 1.3 μm $Al_xGa_yIn_{1-x-y}As$/InP strained-layer quantum-well lasers for subscriber loop application", IEEE Journal of Quantum Electronics, Vol. 30, No. 2, pp. 511–523, 1994 and as disclosed in U.S. Pat. No. 5,381,434 showed, however, no increased problem with reliability. This can be explained, since for their measured results, they used a ridgetype laser structure which does not require exposure of the Al containing layers, contrary to a conventional buried heterostructure. However, a buried heterostructure has the advantage of providing a precise control of the width of the current confinement, resulting in a lower threshold current at room temperature.

STATE OF THE ART

Many approaches have been made to obtain a structure which are designed to confine generated photons in heterostructure lasers.

Such a laser is described in U.S. Pat. No. 4,955,031, which describes a semiconductor heterostructure laser having a confining layer of n-type zinc selenide or zinc manganese selenide. Furthermore U.S. Pat. No. 5,349,596 discloses a semi conductor laser cavity having a zone for optical confinement and light guidance.

U.S. Pat. No. 5,331,655 describes a laser diode with independent electronic and optical confinement which consists of InGaAsP. In the European patent application EP-A1 0 078 177 a semiconductor light-emitting device, of the double heterostructure laser type is disclosed. The disclosed device has barriers and a buffer layer for improved temperature characteristics.

Further, in the European patent application EP-A2 0 202 089 a laser is described comprising several planar semiconductor layers of which at least one forms an active region for light wave generation in a confined optical cavity.

The Japanese patent application JP-A 60-136 388 discloses a light emitting electron device comprising a semiconductor laser which has heterostructural multi-strata of buried blocking layer, and current leakage control film.

However, none of the above mentioned disclosures provides a structure having a sufficiently good temperature dependence.

SUMMARY OF THE INVENTION

It is an object of the present invention to provide semiconductor structures in particular for use in lasers which simultaneously have small temperature sensitivity, low threshold current and are reliable.

This object is achieved by the structure according to the invention, the features and characteristics of which are defined in the appended claims.

Thus, the structure as described hereinafter combines the benefits of 1. avoiding exposure of the Al enhanced barriers, but 2. of maintaining the precise lateral confinement control of the buried region, this being accomplished by using an Al free buried region and external high band gap barriers, where the latter ones may contain Al.

The laser structure thus simultaneously fulfils all of three requirements I, II and III, that is:

I. It has an active region provided with an enhanced transverse carrier confinement, which gives a small temperature sensitivity. The enhanced transverse carrier confinement is obtained by a surrounding material having a substantially higher conduction band and/or larger band gap and/or smaller refractive index for the relevant light wavelength than the substrate material, and thus a higher conduction band difference and/or larger band gap difference and/or smaller refractive index difference for the relevant light wavelength with respect to the conduction band and/or band gap and/or refractive index for the relevant light wavelength of the active region. A layer, having a conduction band higher than and/or a band gap larger than and/or a refractive index for the relevant light wavelength that is smaller than that of the substrate, is below called an enhanced transverse confinement layer.

II. It has an active region provided with a substantially lateral carrier confinement resulting in a low threshold current. This can be obtained by etching and regrowth of a mesa, where the mesa includes the active region.

III. In the processing for producing the laser structure, exposure of the enhanced transverse confinement layers is avoided in the immediate vicinity of the active region, outside the chamber of epitaxial growth what gives a high reliability. This is important in the case where the enhanced transverse confinement layers include Aluminium.

The inner region in the laser structure is free from Al and is transversally separated by one or several separating layers, from the enhanced transverse confinement layers. The lateral confinement of the inner region can then be obtained without exposing, during processing, the enhanced transverse confinement layers outside the chamber of epitaxial growth.

The enhanced transverse confinement layer or layers may:

I-1. include Aluminium

I-2. be graded in composition and thus e.g. be graded in band offsets in order to lower the resistivity I-3. have locally enhanced doping in order to deform the band edges for control of carrier transport I-4. be strained in order to control electron, heavy hole and light hole band edges separately I-5. incorporate multi-barriers in order to enhance, quantum mechanically, carrier blocking I-6. have opposite strain or strains as compared to other layers, in order to decrease the net strain in the structure I-7. have a lower refractive index in order to confine the photons I-8. include a combination of I-1 to I-7.

The lateral confinement of the active region may be achieved by:

II-1. mesa etching, current-blocking regrowth and cap layer growth

II-2. as in II-1, but including ion implantation of a substantial part of the current blocking regions in order to lower current leakage II-3. as in II-1, but including removal by means of etching of a substantial part of the current blocking regions for lowering current leakage and the shunt capacitance II-4. as in II-3, but including regrowth of the secondary etched region II-5. mesa etching, planarized regrowth and ion implantation in order to lower the number of epitaxial steps as compared to II-1

II-6. as in II-5, but including removal by means of etching instead of ion implantation II-7. as in II-6, but including regrowth of the secondary etched region.

Avoiding exposure of enhanced transverse confinement layers may be achieved by:

III-1. a transverse displacement below the active layers mesa

III-2. a transverse displacement above the active layers mesa

III-3. a combination of III-1 and III-2.

Thus, generally a multi-layer semiconductor structure is built on a substrate of e.g. InP or GaAs. The structure has an inner region that is optically and/or electrically substantially laterally confined, that is the inner region is confined in lateral directions. Also, the structure includes at least one enhanced transverse confinement layer, which in one preferred embodiment has a substantially higher band gap than the substrate material. At least one separating layer is arranged between the substantially laterally confined inner region and the at least one enhanced transverse confinement layer. Further, the at least one enhanced transverse confinement layer is not laterally confined in the same way as the inner region. For example it may have no localized lateral confinement and can extend laterally generally in a continuous way.

In the case where the material of the enhanced transverse confinement layer is chosen to obtain a higher band gap for the conduction band electrons compared to that of the substrate material, at least one of the enhanced transverse confinement layers can have a graded composition. Then its band gap will also have graded values, that is gradually or continuously varying values, the values varying from a first value larger than the band gap of the substrate, down to a second value lower than the first value.

The material of the enhanced transverse confinement layers can also chosen to obtain a higher band edge for the conduction band electrons and/or to obtain a lower refractive index for light of a considered wavelength, compared to the substrate. In this case also, at least one of the enhanced transverse confinement layers can have a graded composition.

In an advantageous embodiment the material of at least one of the enhanced transverse confinement layers includes aluminium and the inner region of the structure does not contain any substantial amount of aluminium.

In the production of the structure, at least one buffer layer can be grown immediately before or underneath at least one enhanced transverse confinement layer for facilitating the further growth, reducing mechanical stresses. Also, at least one etch stop layer can be grown after or on top of at least one enhanced transverse confinement layer for stopping an etching procedure that can be used in making the lateral confinement. Then it can be advantageous to grow at least one etch buffer layer between at least one pair of etch stop layer and enhanced transverse confinement layer for relieving mechanical stresses.

Preferably, in making the structure, at least one enhanced transverse confinement layer is grown before or underneath the inner region. Also, at least one enhanced transverse confinement layer can be grown after or above the inner region.

The inner region of the structure can be an active region for producing laser oscillation at a wavelength of e.g. about 1.3 $\mu$m. It can be a strained layer quantum well structure including at least one well.

The lateral confinement of the inner region is in a preferred case made by etching to produce etched first regions and a mesa comprising the inner region and then a regrowth of etched regions can be made. Then, a substantial part of the regrowth regions can be ion implanted. A substantial part of the regrowth regions can then in turn be removed by a second etch to produce second etched regions which can also be regrown.

In the case where the structure is to be used as a laser, some devices such as suitable electrodes must be provided for connection to power means. The structure can then be used as an edge-emitting laser, the lasing light being emitted substantially perpendicular to the growth direction, or as a surface-emitting laser, in which the lasing light is emitted substantially in parallel to the growth direction.

BRIEF DESCRIPTION OF THE DRAWINGS

The invention will now be described in detail below with reference to the accompanying drawings, which are generally schematic, the dimensions in the growth or upwards direction being exaggerated for the sake of clarity, and in which:

FIG. 1 is a schematic cross-sectional view illustrating a specific buried heterostructure, FIG. 2 is a schematic diagram illustrating the band gap and/or refractive index and/or conduction band edge of the structure of FIG. 1 along a long line extending through an inner region, FIG. 5 is a schematic cross-sectional view illustrating the growth of a base structure according to a first embodiment, FIG. 12a is a schematic cross-sectional view of the band diagrams of two quantum well structures, and FIG. 12b is a schematic view of a regrown structure.

DESCRIPTION OF PREFERRED EMBODIMENTS

Figure 3:
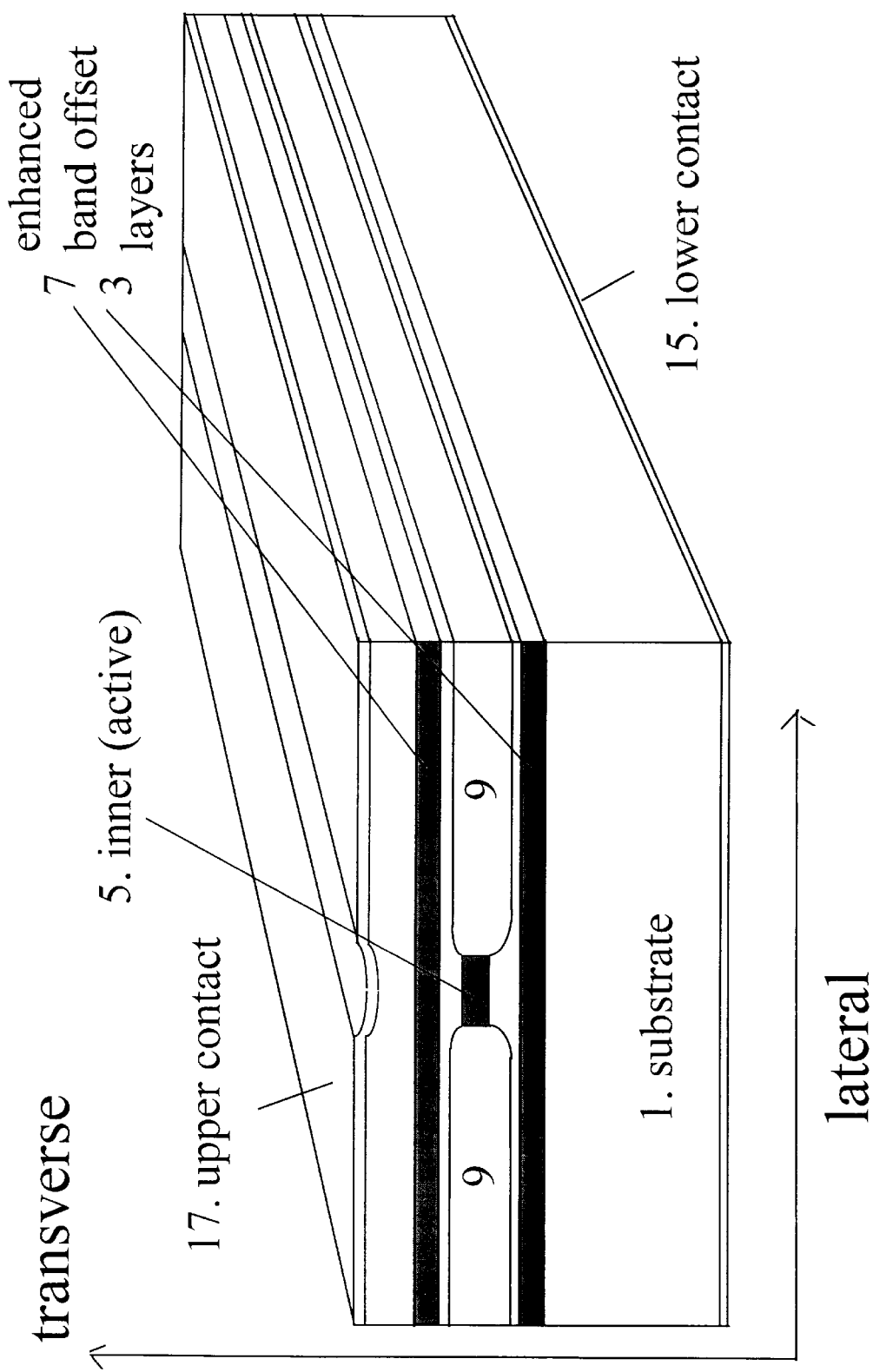
FIG. 3 is a schematic perspective view of an edge emitting laser incorporating a heterostructure similar to that of FIG. 1.

In FIG. 1 a buried heterostructure is shown in a schematic view and it is based on InP and is similar to that illustrated in FIGS. 2 and 3 of the patent U.S. Pat. No. 5,381,434 cited above. The structure can be produced by executing the following process steps:

On some substrate 1, such as a InP substrate, an n-doped InP layer 2 is epitaxially grown. On this n-doped InP layer 2 an n-doped aluminium containing layer 3 such as an InAlAs layer is epitaxially grown and on this an n-doped InGaAsP layer 4 is grown. On this InGaAsP layer 4 the inner region 5 for which the confinement of the photons and electrons is intended is grown. On top of this inner region 5 a p-doped InGaAsP layer 6 is grown.

Different structures can be provided for the inner region 5: it can be a passive waveguide, i.e. have a band gap of energy higher than the signal photons, intended for a tuning region and it would then also contain a grating layer, it can be an active waveguide for laser or laser amplifier operation. These waveguide functions can be obtained by means of a single, rather thick, or a number of strained or unstrained quantum well layers. For all these design cases there are important applications where an improved confinement in a transverse direction of photons and electrons is desired. The transverse direction is essentially perpendicular to the layers depicted in FIG. 1 and thus similar to the growth direction, compare the arrow 10, a lateral direction being defined as perpendicular to the transverse one and in FIG. 1 shown as located in the plane of the paper, see the arrow 11.

After this a suitably shaped mask is placed on the surface of the obtained structure and an etching is performed in order to obtain a platform or mesa structure, as seen in the lateral direction, compare the structure of FIG. 2 in U.S. Pat. No. 5,381,434, to define the extension of the inner region in this direction. The etching is performed in such a manner that the Al containing layer 3 is not exposed. This is possible by stopping the etching above the Al containing layer 3, somewhere inside the n-InGaAsP layer 2. Also, a particular etchstopping layer can be grown somewhere above the sensitive layer 3, as will be described below. Then a regrowth of current blocking layers 9 of e.g. semi-insulating InP (SI-InP) is made on the side of the walls of the inner region mesa. The mask material is removed and thereafter the layer 6 can be extended by growing a little more of p-InGaAsP-material and then another p-doped Al containing barrier layer 7 such as of InAlAs is epitaxially grown on the p-doped InGaAsP layer 6 and on top of the p-doped InAlAs layer 7 a p-doped InP layer 8 is grown.

The buried heterostructure obtained in this way will in some aspects operate in a way similar to the device disclosed in the above cited patent providing a barrier effect by means of the Al-containing layers 3 and 7, this effect being operative in the transverse direction and thus producing a transverse confinement for both photons and electrons. In the lateral direction the confinement is accomplished by the current blocking layers 9. The latter ones comprise a barrier lower than that of the Al-containing material, but here the carrier leakage and optical confinement is less critical due to the larger width of the inner region in that direction.

The structure achieved with the above described process will have Al containing layers 3 and 7 in the growth or transverse direction for confinement of electrons and photons in this direction. Moreover these Al containing layers will not have been exposed outside the chamber for epitaxial growth, and thus an oxidation of the Al containing layers is avoided.

FIG. 2 schematically shows the band gap profile of the material and the refractive index illustrating the electronic and optical confinement barriers 12 produced by the Al-containing layers and the high refractive index of the inner region, indicated at 13.

The structure described above decreases the carrier leakage of electrons and photons in optoelectronic active and passive waveguides while maintaining a good material quality. The structure is especially well suited for InP-based 1.3 μm lasers for low threshold operation at high temperatures.

It can be observed that the structure of FIG. 1 can equally well be constructed with the n- and p-dopings exchanged, the doping structure thus being inverted in the growth direction.

Figure 4:
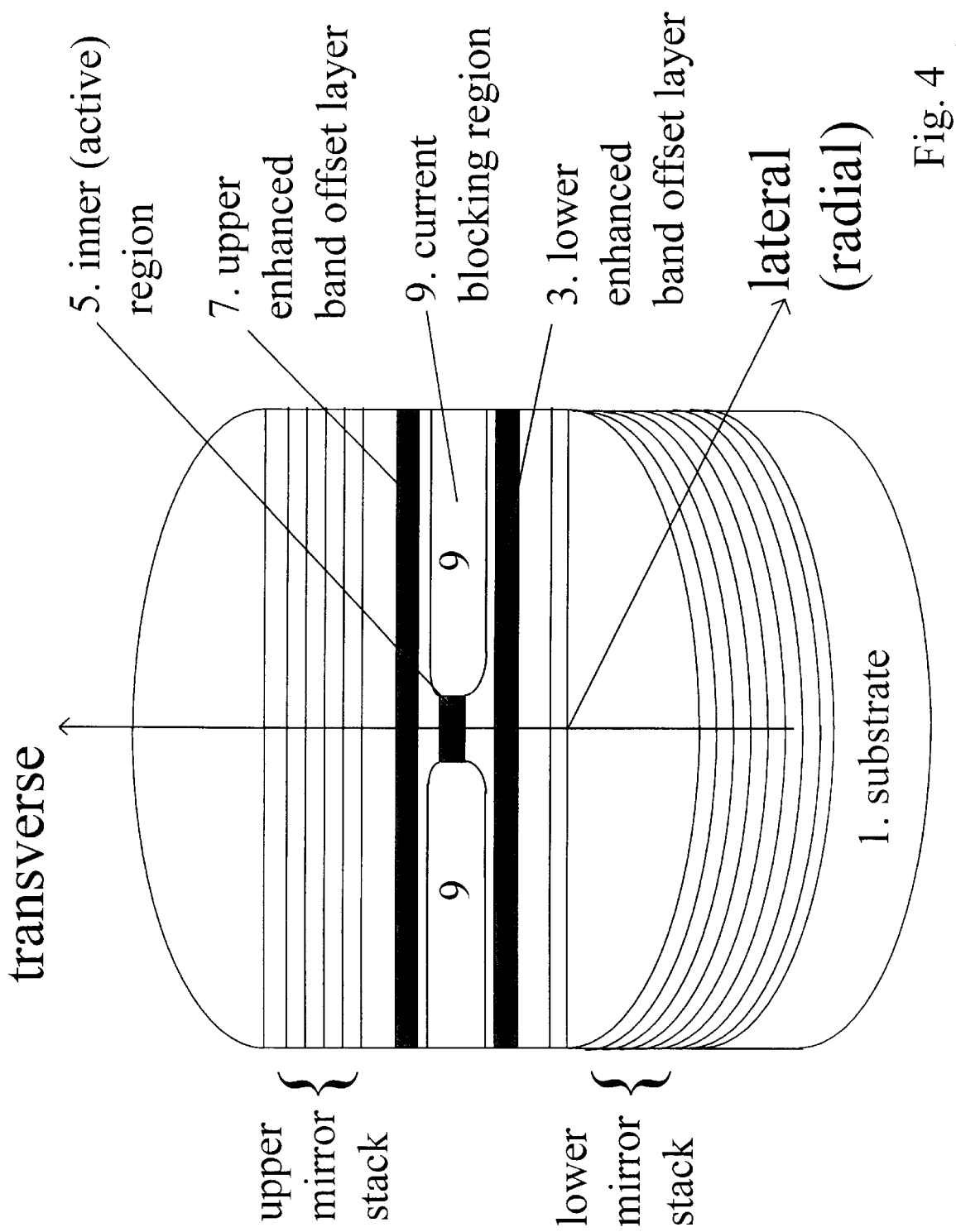
FIG. 4 is a schematic perspective view of a vertical-cavity surface emitting laser incorporating a heterostructure similar to that of FIG. 1.

The basic elements of the structure of FIG. 1 are illustrated for two cases of laser devices, an edge emitting laser (EEL) and a vertical-cavity surface emitting laser (VCSEL), in FIGS. 3 and 4 respectively. For edge-emitting lasers, the light is emitted through facets in the longitudinal direction which is perpendicular to the transverse and lateral directions. For vertical-cavity surface emitting lasers, the lateral and radial directions coincide, and light is emitted in the transverse direction. For VCSELs the feed-back of light necessary for lasing action can be enhanced by e.g. upper and lower Bragg mirror dielectric stacks.

In FIG. 3, showing schematically in a perspective view an edge emitting laser, all layers and regions except the lower pre-buffer layer 2 are shown, the Al-containing layers or enhanced transverse confinement layers 3 and 7 and in particular the lower one being separated by a layer of material having some thickness from the confinement regions 9. Also illustrated in this figure are layers for external electrical contact, a lower contact layer 15 at the bottom of the substrate 1 and an upper contact layer 17 on top of the entire structure.

In FIG. 4 an example of a vertical-cavity surface emitting laser is shown that is constructed as suggested herein. A substrate 1, lower 3 and upper 7 enhanced transverse confinement layers, an inner region 5 and a current blocking region 9 are shown. Here, the lateral direction is a radial direction. Light is emitted in the transverse, growth direction. Also in this FIG. 4 are depicted schematically Bragg mirror dielectric stacks, for improved feed-back of light.

The structure as exemplified by FIG. 1 and described above will now be described more generally as a first general structure A with reference to particularly FIGS. 5–8. Then a modified general structure B will be described with reference to FIGS. 8–10.

The A structure (three epitaxial step structure) is configured and produced as follows:

First, the base structure of A is grown on a substrate base A0, FIG. 5. From bottom to top, in the direction of growth, this structure consists of the substrate base A0, compare layer 1 of FIG. 1, followed by at least three epitaxially grown layers, where at least one of these layers is an active layer A6. Two cases of base structure occur: including or not one or several lower enhanced transverse confinement layers A2. For the case of at least one lower enhanced transverse confinement layer A2, the active layer or layers A6 are located above the lower enhanced transverse confinement layer or layers A2, and separated from these by at least one lower separating layer A5. On top of the active layer or layers A6, one or several upper separating layers A7 may be grown already in this first epitaxial step but it can also be grown later. The epitaxial growth quality may be enhanced by one or several lower pre-buffer layers A1. One or several etch-stop layers A4 (for example made of InP in the embodiment illustrated in FIG. 1) may be required in the next processing step. Then also one or several lower post-buffer layers A3 (this can also be a InP-layer for the case shown in FIG. 1) may be needed in order to assure the etch not to expose the lower enhanced transverse confinement layer or layers A2. The lower layers A0–A5 may be n-doped or p-doped. The substrate base A0 may also be semi-insulating, where in this case unconventional contacts must be formed. The upper separating layer or layers A7 may be undoped, or doped with the opposite polarity in order to form a pn-junction. The active layer or layers A6 may be n-doped, undoped or p-doped, comprising bulk material or a quantum well structure comprising one or several strained or unstrained layers including or not including strain-compensation in the barriers which separate the wells.

Figure 6:
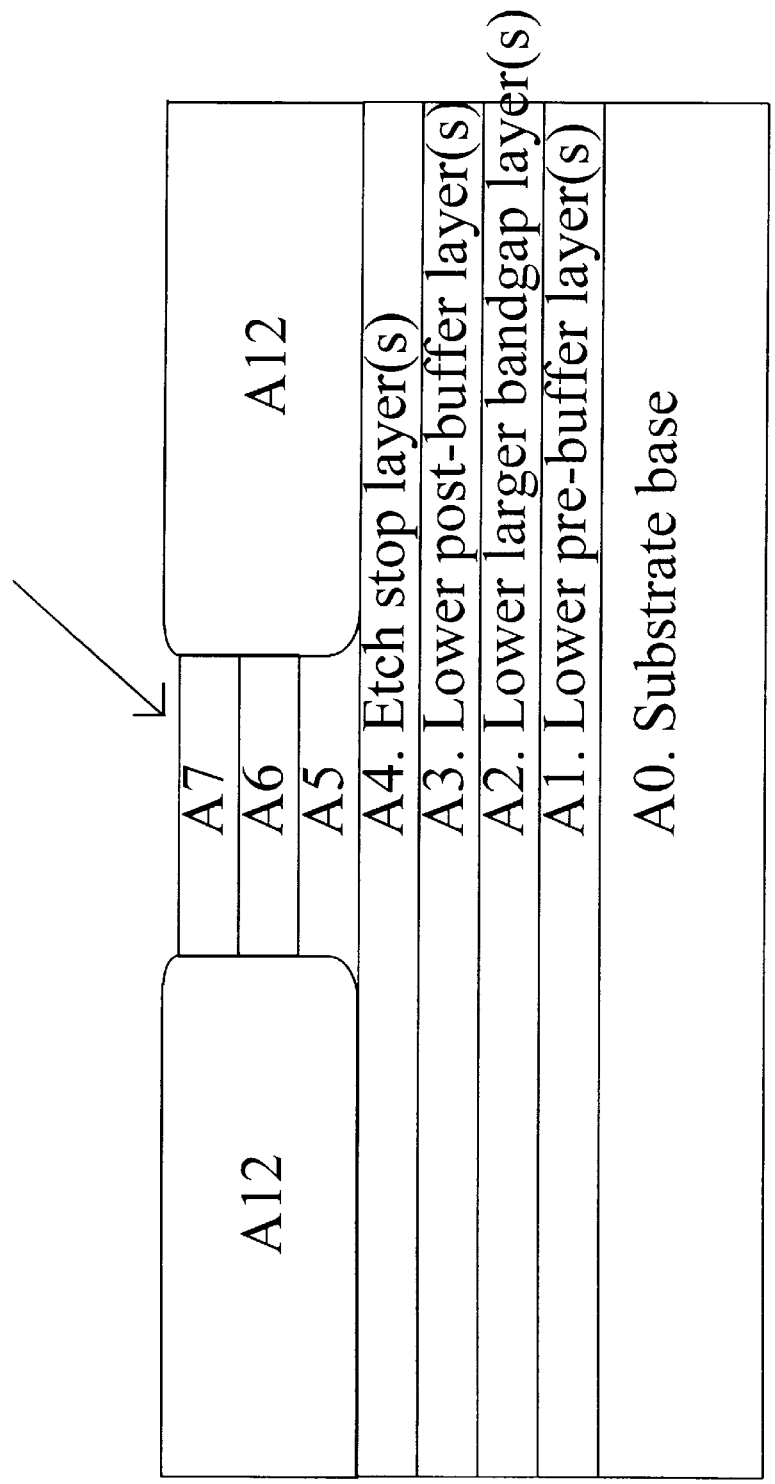
FIG. 6 is a schematic cross-sectional view corresponding to FIG. 5, where the structure also includes regrown lateral confinement structures.

Second, the regrown structure of A including lateral confinement is formed, as is schematically illustrated in FIG. 6. Thus, the base structure unit is removed from the growth chamber and is laterally selectively etched from above, by e.g. reactive ion etching or wet etching. The lateral selection may be provided by a mask applied on top of the structure.

The etching extends through the active layer or layers A6, forming a mesa 21 having walls on the sides thereof. Thus at these sides, edges of the layers within the etched mesa 21 are exposed outside the growth chamber. However, the etching is stopped in, or by, either one of the layers A5–A3. The lower enhanced transverse confinement layer or layers A2, which may contain Al, are thus not exposed outside the growth chamber. The precise control of the etch-stop may be provided by one or several etch-stop layers A4 above the lower enhanced transverse confinement layer or layers A2. Then the etched surface is regrown to form at least one regrown layer A12, forming a buried heterostructure to provide also a lateral confinement of the active region. The regrown layer or layers A12 may be semi-insulating (SI), or np-blocking, or some other current-blocking, carrier-confining structure.

Figure 7:
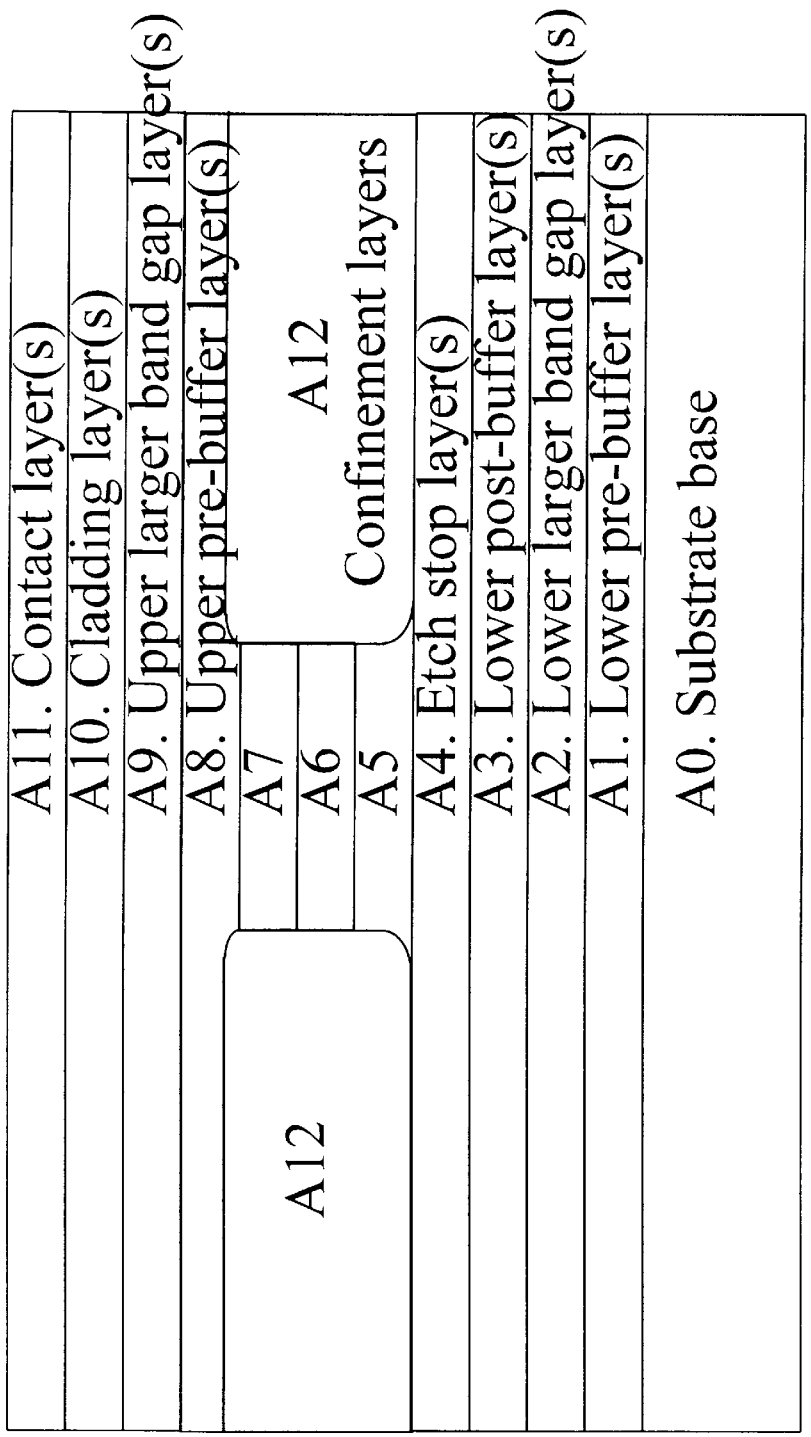
FIG. 7 is a schematic cross-sectional view corresponding to FIG. 6, where the structure includes a grown top structure.

Third, the t op structure of A is formed, as is illustrated in FIG. 7. On top of the regrown structure, a top structure is grown. The top structure comprises at least one layer. Two cases of top structure occur: including or not one or several upper enhanced transverse confinement layers A9, such that the complete structure contains at least one enhanced transverse confinement layer, A2 or/and A9. For the case of at least one upper enhanced transverse confinement layer A9, the active layer or layers A6 are located below the upper enhanced transverse confinement layer or layers A9. One or several upper separating layers A7, and also one or several upper pre-buffer lay ers A8, may separate the upper enhanced transverse confinement layer or layers A9 from the active layer or layers A6, and the regrown current-blocking layer or layers A12, for enhanced growth quality. One or several cladding layers A10, followed by one or several contact layers A11, can be grown uppermost on the top structure to produce low ohmic resistivity when metallised contacts are formed. The upper layers A7–A11 may be doped to a polarity opposite to that of the doped layers below the active layer or layers A6, in order to form for the complete structure a pn-junction suitable for current injection.

Figure 8:
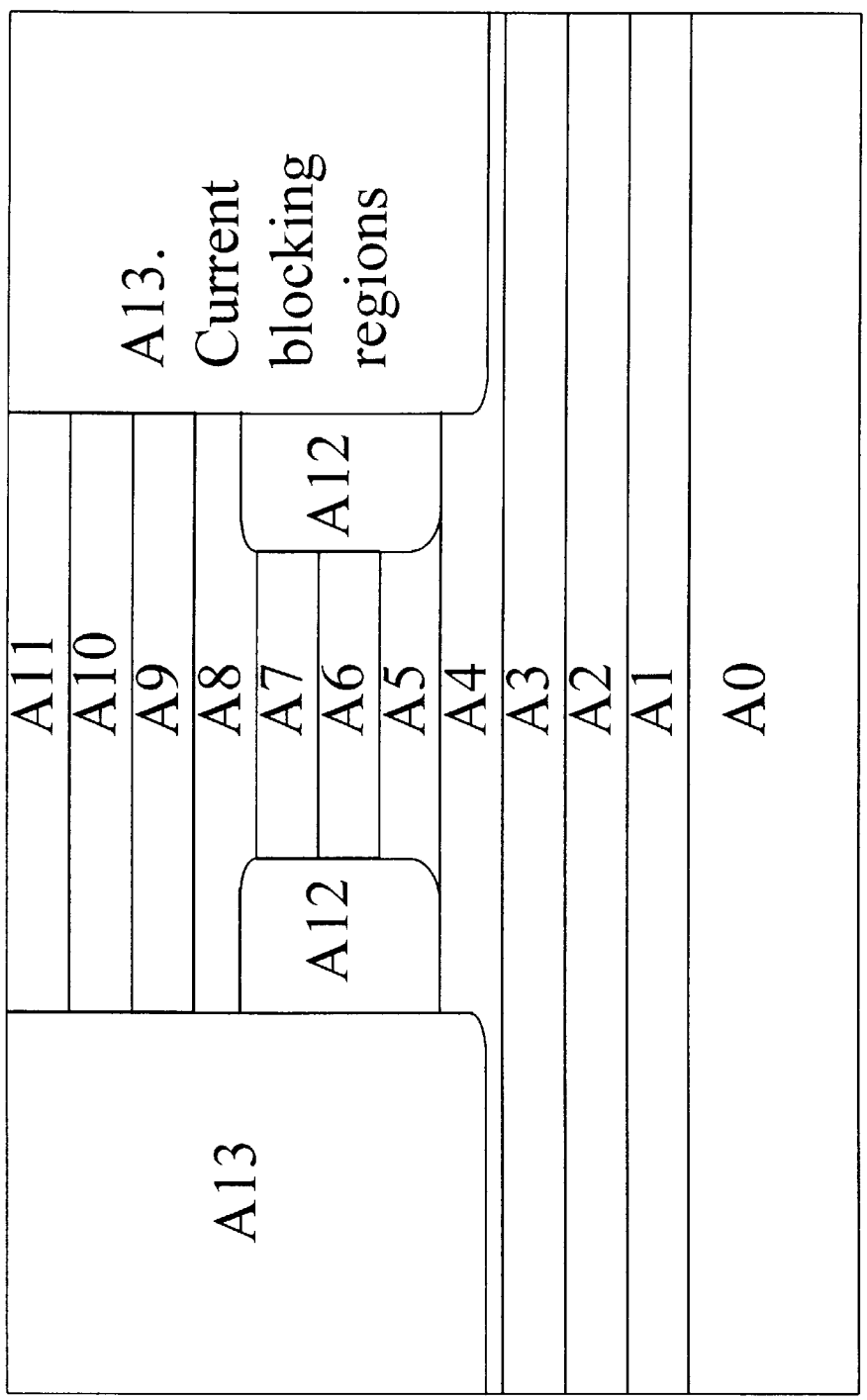
FIG. 8 is a schematic cross-sectional view corresponding to FIG. 7, the structure also including current blocking regions.

The total thickness of the active layer or layers A6 may restrict the thickness of the current blocking, regrowth layer or layers A12, in such a way that a laterally too wide material region A12 produces a too low resistance or a too high capacitance. Then the lateral width of the region A12 may be lowered by further processing, by means of a selective second etching including a possible regrowth of the secondary etched region, or by selective ion implantation, forming improved current-blocking regions A13, as is schematically illustrated in FIG. 8. By using a blocking mask wider than the mesa 21, which include the active layer or layers A6 this or these layers can be effectively protected from boundary or border effects, oxidation or ion implantation, that may obtained from the regions A13 or in the process when they are manufactured.

Figure 9:
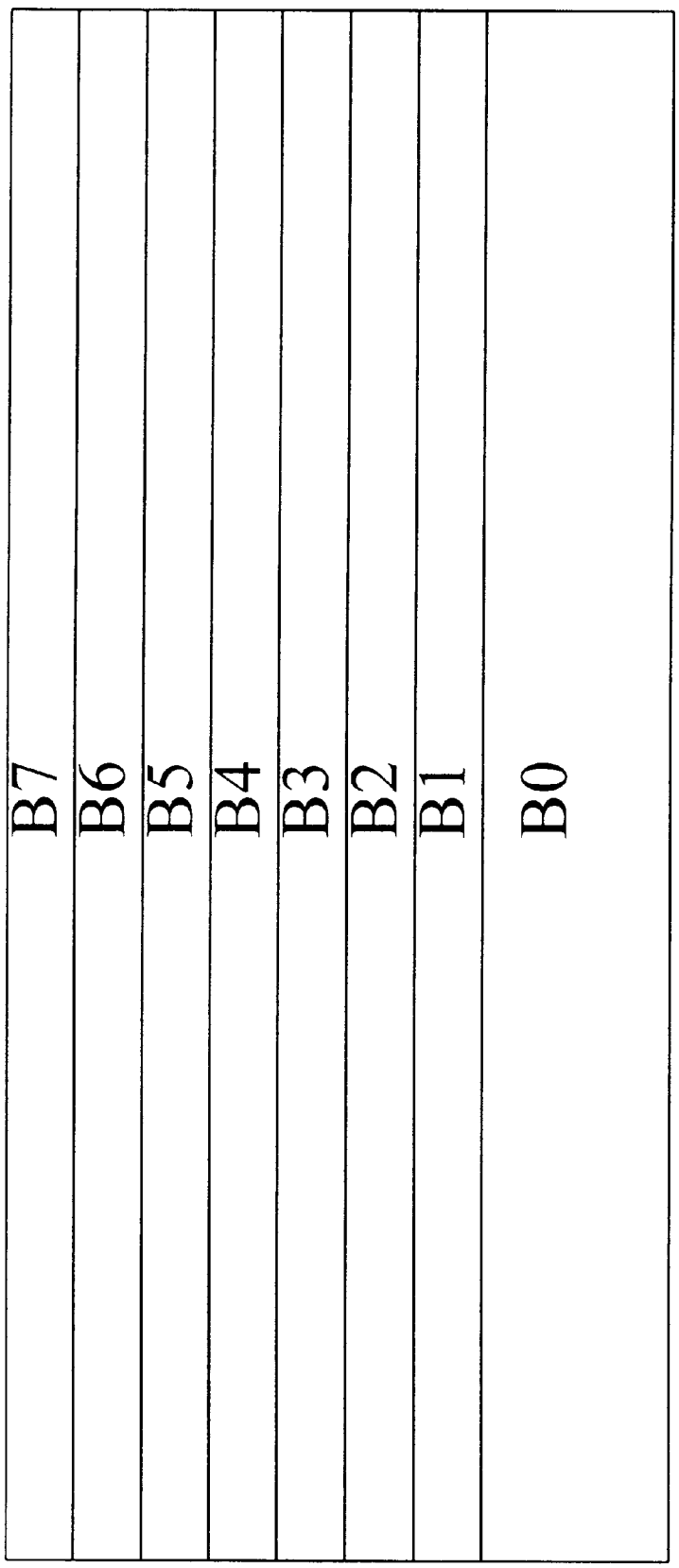
FIG. 9 is a schematic cross-sectional view illustrating the growth of a base structure according to a second embodiment.

The modified structure (two epitaxial step structure) B is configured and produced as follows:

First, a base structure of B is grown on a substrate base B0, FIG. 9. From bottom to top, in the direction of growth, this structure consists of the substrate base B0, followed by at least one epitaxially grown layer, where at least one of this layer or layers is an active layer B6. Two cases of base structure occur: including or not including one or several lower enhanced transverse confinement layers B2. For the case of at least one lower enhanced transverse confinement layer B2, the active layer or layers B6 are located above the lower enhanced transverse confinement layer or layers B2, and separated therefrom by at least one lower separating layer B5. On top of the active layer or layers B6, one or several upper separating layers B7 may be grown already in this first epitaxial step but they can also be grown later. The epitaxial growth quality may be enhanced by one or several lower pre-buffer layers B1. One or several etch-stop layers B4 may be required in the next processing step. Then also one or several lower post-buffer layers B3 may be needed in order to assure the etch not to expose the lower enhanced transverse confinement layer or layers B2. The lower layers B0–B5 may be n-doped or p-doped. The substrate base B0 may also be semi-insulating, and in this latter case unconventional contacts must be formed. The upper separating layer or layers B7 may be undoped, or doped to the opposite polarity in order to form a pn-junction. The active layer or layers B6 may be n-doped, undoped or p-doped, comprising bulk material or a quantum well structure comprising one or several strained or unstrained layers including or not including strain-compensation in the barriers which separate the wells.

Figure 10:
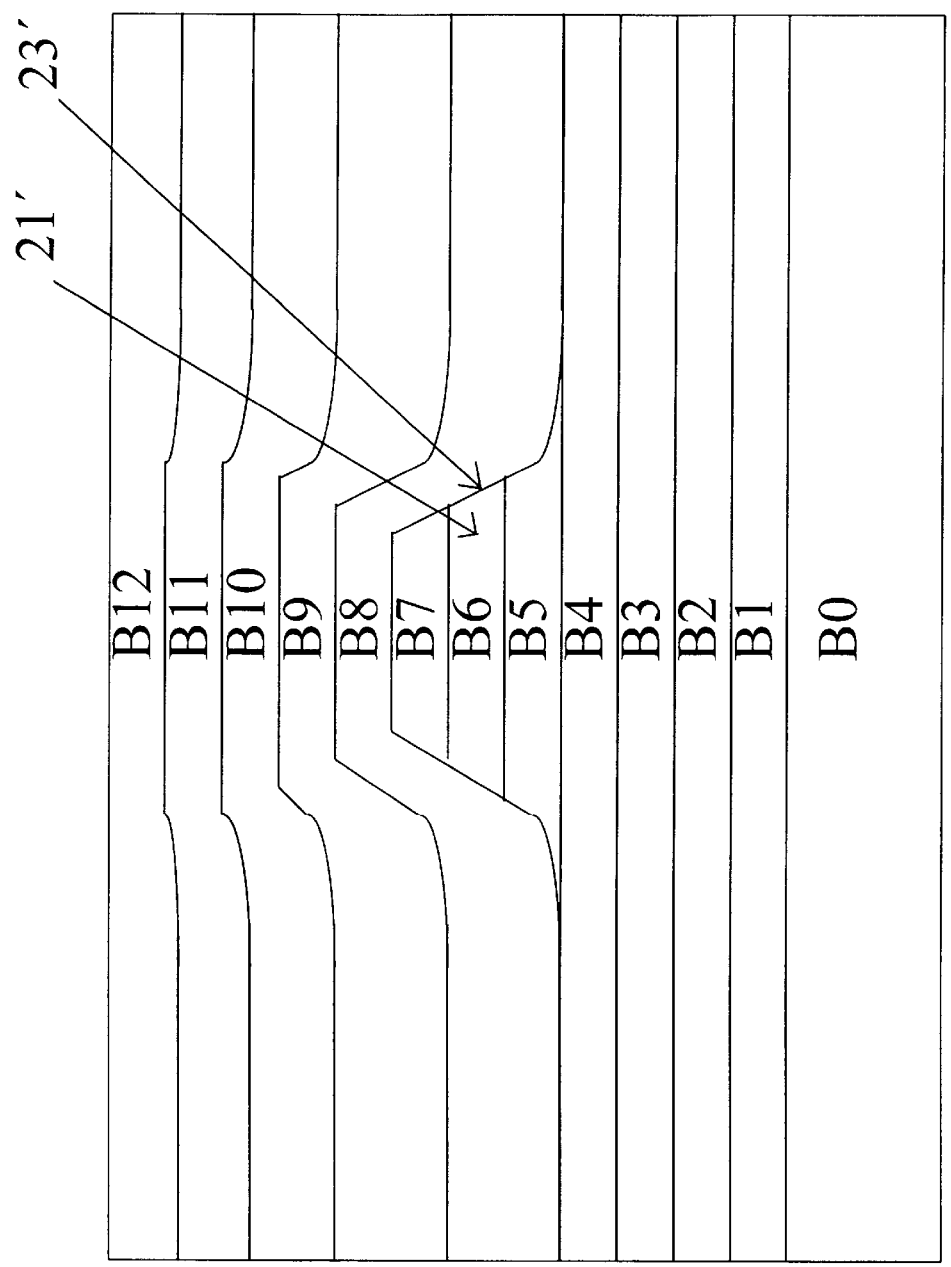
FIG. 10 is a schematic cross-sectional view corresponding to FIG. 9, where the structure also includes a grown top structure comprising lateral confinement.

Second, the regrown structure of B including a lateral confinement and top structure is formed, as is schematically illustrated in FIG. 10. Thus, the base structure is removed from the growth chamber and laterally selectively etched from above, by e.g. reactive ion etching or wet etching. The lateral selection may be provided by a mask applied on top of the structure. The etching extends through the active layer or layers B6 forming a mesa 21' having walls on the sides 23' thereof. For the B structure, the sides 23' are etched so that a planar regrowth can be made. At these sides 23' sloping edges of the layers within the etched mesa are exposed outside the growth chamber.

However the etching is stopped in, or by either of the layers B5–B3. The lower enhanced transverse confinement layer or layers B2, which may contain Al, are thus not exposed outside the growth chamber. The precise control of the etch-stop may be provided by one or several extra etch-stop layers B4, above the lower enhanced transverse confinement layer or layers B2. Then the etched surface is regrown by at least one regrowth layer B8, forming a planarized buried heterostructure to provide optical lateral confinement of the active region, followed by a top structure in the same growth step. Here, the B8 layer is not current-blocking. Two cases of top structure occur: including or not including one or several upper enhanced transverse confinement layers B10, such that the complete structure contains at least one enhanced transverse confinement layer, B2 or/and B10.

For the case of at least one upper enhanced transverse confinement layer B10, the active layer or layers B6 are located below the upper enhanced transverse confinement layer or layers B10. One or several upper separating layers B7, one or several regrowth layers B8, and also one or several upper pre-buffer layers B9, may separate the upper enhanced transverse confinement layer or layers B10, from the active layer or layers B6. The upper pre-buffer layer or layers B9, that may separate the upper enhanced transverse confinement layer or layers B10 from the regrowth layer or layers B8, may improve the epitaxial growth quality. One or several cladding layers B11, followed by one or several contact layers B12, can be grown uppermost on the top structure to produce a low ohmic resistivity when metallised contacts are formed. The upper layers B7–B12 may be doped to a polarity opposite to that of the doped layers below the active layer or layers B6, in order to form for the complete structure a pn-junction suitable for current injection.

Figure 11:
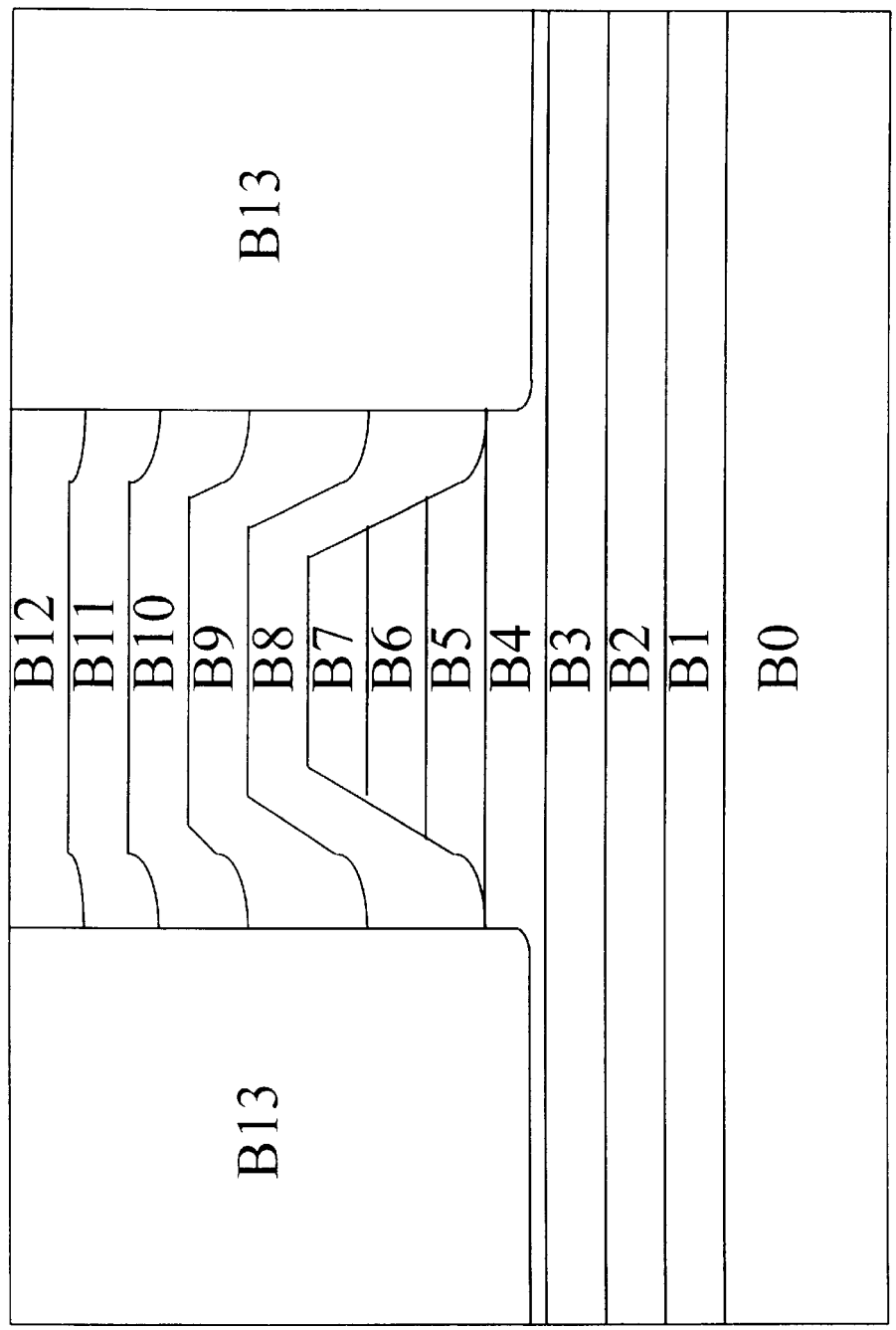
FIG. 11 is a schematic cross-sectional view corresponding to FIG. 10, where the structure also includes current blocking regions

To minimize current leakage the lateral width of the region B8 should be decreased by further preparation, through selective etching with a possible regrowth of the secondary etched region, or by selective ion implantation, forming improved current-blocking regions B13, as is schematically illustrated in FIG. 11. By using a blocking mask slightly wider than the mesa 21' which includes the active layer or layers B6, this layer or layers can be effectively protected from border effects, from oxidation or ion implantation when producing the regions B13.

In FIG. 12a band diagrams are shown of two quantum well laser structures, a first structure having an offset-enhancing layer of $In_{0.53}Al_{0.47}As$ and having a band diagram drawn in solid lines and a second structure having no such layer and having a band diagram drawn in dotted lines. In the upper part of the figure the conduction $E_c$ band diagrams are shown and in the lower part the valence $E_v$ band diagrams. The first structure employs a 400 nm thick $In_{0.53}Al_{0.47}As$ layer in the interval of 0.46–0.86 $\mu$m (p-near) of the p-region substantially lattice-matched to InP, whereas the second structure uses conventional InP in the whole p-region. For both structures, the p-region starts from the left hand side with p-doped InP (p-InP) having a dopant concentration of $2 \cdot 10^{18}$ cm$^{-3}$. In the p-near region, the p-doping is linearly graded from $2 \cdot 10^{18}$ cm$^{-3}$ down to zero. The undoped, active region (having the designation i in the figure) consists of 5 InGaAsP 1%-compressively strained quantum wells, each 6 nm thick, having a composition corresponding to a lasing wavelength of 1.3 $\mu$m. The quantum wells are separated by barrier layers having a thickness of 8 nm. The wells and the barriers are embedded between separate confinement layers having a thickness of 75 nm. The separate confinement and barrier layers are all of InGaAsP-composition, having a band gap wavelength of 1.0 $\mu$m and are lattice-matched to InP. The n-InP region is uniformly doped to $1 \cdot 10^{18}$ cm$^{-3}$. The position axis is aligned along the transverse direction, within the buried mesa. Observe that in the figure the position axis is directed from the p-side towards the n-side.

From FIG. 12a it is obvious that the offset of the conduction band is substantially enhanced, more than 100 meV, owing to the use of $In_{0.53}Al_{0.47}As$ instead of InP in the p-near layer.

In FIG. 12b a schematic view of the first and second structures is shown and it illustrates the regrown structure, as seen from the front-facet of an edge-emitting device. The i region but not the p-near region has been mesa-etched and regrown.

We claim:

1. A multi-layer semiconductor structure for emitting, when electrically energized, light of a definite wavelength and including:

a substrate, an inner, active region which is substantially aluminum-free, lateral confinement regions optically and electrically confining the inner, active region in two opposite lateral directions, at least one aluminum-containing lower layer optically and electrically confining the inner, active region in a transverse direction downwards from the inner, active region, at least one aluminum-free lower layer located between the inner, active region and the at least one lower aluminum-containing layer, the lateral confinement regions extending in the transverse direction downward into and terminating in the at least one lower aluminum-free layer, whereby, during a period of manufacture of the semiconductor structure when the lateral confinement regions are produced, the at least one aluminum-containing lower layer does not have to be exposed to atmosphere and hence will not be oxidized.

2. The multi-layer semiconductor structure of claim 1, wherein the at least one aluminum-containing lower layer comprises a material having a band gap for conduction band electrons, which is larger than the band gap of the material of the inner, active region and/or than the band gap of the material of the at least one aluminum-free lower layer.

3. The multi-layer semiconductor structure of claim 2, wherein the at least one aluminum-containing lower layer is graded in composition and has a band gap varying from a first value larger than the band gap of the substrate down to a second value lower than the first value.

4. The multi-layer semiconductor structure of claim 1, wherein the at least one aluminum-containing lower layer comprises a material having a band edge for conduction band electrons, which is higher than the band edge of the material of the inner, active region and/or than the band edge of the material of the at least one aluminum-free lower layer.

5. The multi-layer semiconductor structure of claim 1, wherein the at least one aluminum-containing lower layer comprises a material having a refractive index for light of the definite wavelength which is lower than the refractive index of the material of the inner, active, region and/or than the refractive index of the material of the at least one aluminum-free lower layer.

6. The multi-layer semiconductor structure of claim 1, wherein the substrate comprises InP.

7. The multi-layer semiconductor structure of claim 1, further comprising at least one buffer layer located directly underneath the at least one aluminum-containing lower layer.

8. The multi-layer semiconductor structure of claim 1, further comprising at least one etch stop layer located directly underneath the at least one aluminum-free lower layer.

9. The multi-layer semiconductor structure of claim 8, further comprising at least one etch buffer layer located between the at least one etch stop layer and the at least one aluminum-containing lower layer.

10. The multi-layer semiconductor structure of claim 1, further comprising at least one aluminum-containing upper layer located above the inner, active region and optically and electrically confming the inner, active region in a transverse direction upwards from the inner, active region.

11. The multi-layer semiconductor structure of claim 10, further comprising at least one aluminum-free upper layer located between the inner, active region and the at least one aluminum-containing upper layer, the lateral confinement regions extending in the transverse direction upwards into and terminating in the at least one aluminum-free upper layer.

12. The multi-layer semiconductor structure of claim 1, wherein the inner, active region comprises a region for producing laser oscillation at a wavelength of substantially 1.3 $\mu$m.

13. The multi-layer semiconductor structure of claim 1, wherein the inner, active region is a strained layer quantum well structure including at least one well.

14. A multi-layer semiconductor structure for emitting, when electrically energized, light of a definite wavelength and including:

a substrate, an inner, active region which is substantially aluminum-free, lateral confinement regions optically and electrically confining the inner, active region in two opposite lateral directions, at least one aluminum-containing upper layer optically and electrically confining the inner, active region in a transverse direction upwards from the inner, active region, at least one aluminum-free upper layer located between the inner, active region and the at least one aluminum-containing lower layer, the lateral confinement regions extending in the transverse direction upwards into and terminating in the at least one aluminum-free upper layer, whereby in the manufacture of the semiconductor structure, the lateral confinement regions can be produced before the at least one aluminum-containing upper layer which hence does not have to be exposed to the atmosphere in producing the lateral confinement regions and hence will not be oxidized.

15. The multi-layer semiconductor structure of claim 14, wherein the at least one aluminum-containing upper layer comprises a material having a band gap for conduction band electrons, which is larger than the band gap of the material of the inner, active region and/or than the band gap of the material of the at least one aluminum-free upper layer.

16. The multi-layer semiconductor structure of claim 15, wherein the at least one aluminum-containing upper layer is graded in composition and has a band gap varying from a first value larger than the band gap of the substrate down to a second value lower than the first value.

17. The multi-layer semiconductor structure of claim 14, wherein the at least one aluminum-containing upper layer comprises a material having a band edge for the conduction band electrons, which is higher than the band edge of the material of the inner, active region and/or than the band edge of the material of the at least one aluminum-free upper layer.

18. The multi-layer semiconductor structure of claim 14, wherein the at least one aluminum-containing layer comprises a material having a refractive index for light of the definite wavelength which is lower than the refractive index of the material of the inner, active, region and/or than the refractive index of the material of the at least one aluminum-free upper layer.

19. The multi-layer semiconductor structure of claim 14, wherein the substrate comprises InP.

20. The multi-layer semiconductor structure of claim 14, further comprising at least one buffer layer located between the at least one aluminum-containing layer and the at least one aluminum-free upper layer.

21. A method of producing a multi-layer semiconductor structure for emitting, when electrically energized, light of a definite wavelength, the method comprising the steps of:

providing a substrate, producing thereon at least one aluminum-containing lower layer, producing thereon at least one aluminum-free lower layer, producing thereon an inner, active region which is substantially aluminum-free, materials of the inner, active region and of the aluminum-containing lower layer being selected so that the inner, active region is optically and electrically confined by the at least one aluminum-containing lower layer in a transverse direction downwards from the inner, active region, producing lateral confinement regions to optically and electrically confine the inner, active region in two opposite lateral directions by firstly making from above recesses on two opposite sides of the inner, active region, the recesses extending in the transverse direction downwards into and being made to terminate in the at least one aluminum-free lower layer, so that a portion of the at least one aluminum-free lower remains on top of the at least one aluminum-containing lower layer whereby the at least one aluminum-containing layer is not exposed to atmosphere and hence will not be oxidized, and by secondly filling the recesses with material to produce an optical and electrical confinement of the inner, active region, and producing a top structure.

22. The method of claim 21, wherein in the step of producing the at least one aluminum-containing lower layer it is selected to comprise a material having a band gap for conduction band electrons, which is larger than the band gap of the material of the inner, active region and/or than the band gap of the material of the at least one aluminum-free lower layer.

23. The method of claim 22, wherein in the step of producing the at least one aluminum-containing lower layer one of the at least one aluminum-containing lower layer is produced to have a graded composition and to have a band gap varying from a first value larger than the band gap of the substrate down to a second value lower than the first value.

24. The method of claim 21, wherein in the step of producing the at least one aluminum-containing lower layer it is selected to comprise a material having a band edge for conduction band electrons, which is higher than the band edge of the material of the inner, active region and/or than the band edge of the material of the at least one aluminum-free lower layer.

25. The method of claim 21, wherein in the step of producing the at least one aluminum-containing lower layer it is selected to comprise a material having a refractive index for light of the definite wavelength which is lower than the refractive index of the material of the inner, active, region and/or than the refractive index of the material of the at least one aluminum-free lower layer.

26. The method of claim 21, wherein in the step of providing the substrate it is selected to comprise InP.

27. The method of claim 21, further comprising the step of producing at least one buffer layer to be located directly underneath the at least one aluminum-containing lower layer.

28. The method of claim 21, further comprising the step of producing at least one etch stop layer to be located directly underneath the at least one aluminum-free lower layer.

29. The method of claim 28, further comprising the step of producing at least one etch buffer layer to be located between the at least one etch stop layer and the at least one aluminum-containing lower layer.

30. The method of claim 21, further comprising the step of producing at least one aluminum-containing upper layer to be located above the inner, active region and to optically and electrically confine the inner, active region in a transverse direction upwards from the inner, active region.

31. The method of claim 30, comprising the additional step of producing at least one aluminum-free upper layer to be located between the inner, active region and the at least one aluminum-containing upper layer, in the step of producing the lateral confinement regions they being produced to extend in the transverse direction upwards into and to terminate in the at least one aluminum-free upper layer.

32. The method of claim 31, wherein in the step of producing the inner, active region it is produced to comprise a region for producing laser oscillation at a wavelength of substantially 1.3 $\mu$m.

33. The method of claim 31, wherein in the step of producing the inner, active region it is produced to comprise a strained layer quantum well structure including at least one well.

34. The method of claim 21, wherein in the step of producing the lateral confinement regions, recesses are made by a first etching to produce first etched regions and thereupon the first etched regions are filled comprising a regrowth to produce first regrowth regions.

35. The method of claim 34, wherein in the step of producing the lateral confinement regions, substantial portions of the first regrowth regions are ion implanted.

36. The method of claim 34, wherein in the step of producing the lateral confinement regions, substantial portions of the first regrowth regions are removed by a second etching to produce second etched regions.

37. The method of claim 36, wherein in the step of producing the lateral confinement regions, the second etched regions are filled comprising a regrowth to produce second regrowth regions.

38. A method of producing a multi-layer semiconductor structure for emitting, when electrically energized, light of a definite wavelength, the method comprising the steps of:

providing a substrate, producing thereon a bottom structure, producing thereon an inner, active region which is substantially aluminum-free, producing thereon at least one aluminum-free upper layer, producing lateral confinement regions to optically and electrically confine the inner, active region in two opposite lateral directions by firstly making from above recesses on two opposite sides of the inner, active region, and by secondly filling the recesses with material to produce an optical and electrical confinement of the inner, active region, producing thereon at least one aluminum-containing upper layer, materials of the inner, active region and of the aluminum-containing upper layer being selected so that the inner, active region is optically and electrically confined by the at least one aluminum-containing lower layer in a transverse direction upwards from the inner, active region, and producing thereon a top structure, whereby the lateral confinement regions extend in the transverse direction upwards into and terminate in the at least one aluminum-free upper layer, whereby in the manufacture of the semiconductor structure, the lateral confinement regions can be produced before the at least one aluminum-containing upper layer which hence does not have to be exposed to atmosphere in producing the lateral confinement regions and hence will not be oxidized.

39. The method of claim 38, wherein in the step of producing the at least one aluminum-containing upper layer it is selected to comprise a material having a band gap for conduction band electrons, which is larger than the band gap of the material of the inner, active region and/or than the band gap of the material of the at least one aluminum-free upper layer.

40. The method of claim 39, wherein in the step of producing the at least one aluminum-containing lower layer, one of the at least one aluminum-containing upper layer is produced to have a graded composition and to have a band gap varying from a first value larger than the band gap of the substrate down to a second value lower than the first value.

41. The method of claim 38, wherein in the step of producing the at least one aluminum-containing upper layer it is selected to comprise a material having a band edge for conduction band electrons, which is higher than the band edge of the material of the inner, active region and/or than the band edge of the material of the at least one aluminum-free upper layer.

42. The method of claim 38, wherein in the step of producing the at least one aluminum-containing upper layer it is selected to comprise a material having a refractive index for light of the definite wavelength which is lower than the refractive index of the material of the inner, active, region and/or than the refractive index of the material of the at least one aluminum-free upper layer.

43. The method of claim 38, wherein in the step of providing the substrate it is selected to comprise InP.

44. The method of claim 38, further comprising the step of producing at least one buffer layer to be located directly underneath the at least one aluminum-containing lower layer.

45. The method of claim 38, wherein in the step of producing the lateral confinement regions, recesses are made by a first etching to produce first etched regions and thereupon the first etched regions are filled comprising a regrowth to produce first regrowth regions.

46. The method of claim 45, wherein in the step of producing the lateral confinement regions, substantial portions of the first regrowth regions are ion implanted.

47. The method of claim 45, wherein in the step of producing the lateral confinement regions, substantial portions of the first regrowth regions are removed by a second etching to produce second etched regions.

48. The method of claim 47, wherein, in the step of producing the lateral confinement regions, the second etched regions are filled comprising a regrowth to produce second regrowth regions.

* * * * *